US012648410B2

(12) United States Patent
Xu et al.

(10) Patent No.: US 12,648,410 B2
(45) Date of Patent: Jun. 2, 2026

(54) CHUCK STRUCTURE OF SEMICONDUCTOR CLEANING APPARATUS AND SEMICONDUCTOR CLEANING APPARATUS

(71) Applicant: BEIJING NAURA MICROELECTRONICS EQUIPMENT CO., LTD., Beijing (CN)

(72) Inventors: Lu Xu, Beijing (CN); Hongyu Zhao, Beijing (CN); Aibing Li, Beijing (CN); Songming Zhang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 421 days.

(21) Appl. No.: 17/910,830

(22) PCT Filed: Feb. 22, 2021

(86) PCT No.: PCT/CN2021/077242
§ 371 (c)(1),
(2) Date: Sep. 12, 2022

(87) PCT Pub. No.: WO2021/179896
PCT Pub. Date: Sep. 16, 2021

(65) Prior Publication Data
US 2023/0098212 A1      Mar. 30, 2023

(30) Foreign Application Priority Data
Mar. 12, 2020    (CN) .......................... 202010171113.3

(51) Int. Cl.
*H10P 72/78*       (2026.01)
*H10P 72/00*       (2026.01)

(52) U.S. Cl.
CPC .......... *H10P 72/78* (2026.01); *H10P 72/0406* (2026.01)

(58) Field of Classification Search
CPC ........... H01L 21/6838; H01L 21/67028; H01L 21/67023; H01L 21/683; H01L 21/67051;
(Continued)

(56) References Cited

U.S. PATENT DOCUMENTS 5,753,891 A *  5/1998  Iwata ................ H01L 21/67109
219/390
10,882,141 B2 *  1/2021  Matsumura .......... B23K 26/142
(Continued)

FOREIGN PATENT DOCUMENTS

CN        104813460 A     7/2015
CN        107301964 A     10/2017
(Continued)

OTHER PUBLICATIONS

The European Patent Office (EPO) The Extended European Search Report for 21767425.8, Apr. 3, 2024 8 Pages.
The World Intellectual Property Organization (WIPO) International Search Report for PCT/CN2021/077242 May 28, 2021 6 Pages (including translation).

*Primary Examiner* — Monica S Carter
*Assistant Examiner* — Christopher Soto
(74) *Attorney, Agent, or Firm* — ANOVA LAW GROUP, PLLC

(57) ABSTRACT

Embodiments of the present disclosure provide a chuck structure of a semiconductor cleaning apparatus and a semi-conductor cleaning apparatus. The chuck structure includes a chuck base, a gas inlet control device, and a first gas channel and a second gas channel arranged in the chuck base and both configured to spray a gas toward the to-be-pro-cessed workpiece. A gas spray direction of the first gas channel is inclined toward the outside of the surface of the to-be-processed workpiece that is opposite to the chuck (Continued)

base. A gas spray direction of the second gas channel is perpendicular to the surface of the to-be-processed workpiece that is opposite to the chuck base. The gas inlet control device is configured to selectively supply the gas to at least one of the first gas channel and the second gas channel to cause the to-be-processed workpiece to be able to float at different height positions.

20 Claims, 6 Drawing Sheets

(58) Field of Classification Search
CPC .......... H01L 21/6833; H01L 21/68785; Y02P 70/50; H01J 37/3244
USPC ......................... 279/3; 451/289, 388; 269/21
See application file for complete search history.

(56) References Cited

U.S. PATENT DOCUMENTS

| | | | |
|---|---|---|---|
| 2006/0205217 A1 | 9/2006 | Pan et al. | |
| 2011/0308554 A1* | 12/2011 | Namba | H01L 21/67051 |
| | | | 134/94.1 |
| 2013/0127102 A1 | 5/2013 | Kinoshita et al. | |
| 2019/0311938 A1* | 10/2019 | Chen | H01L 21/68735 |

FOREIGN PATENT DOCUMENTS

| | | |
|---|---|---|
| CN | 110610894 A | 12/2019 |
| CN | 111341718 A | 6/2020 |
| JP | 2015103701 A | 6/2015 |
| KR | 20090070663 A | 7/2009 |

* cited by examiner

Gas outlet          Gas outlet

Gas inlet

Gas inlet

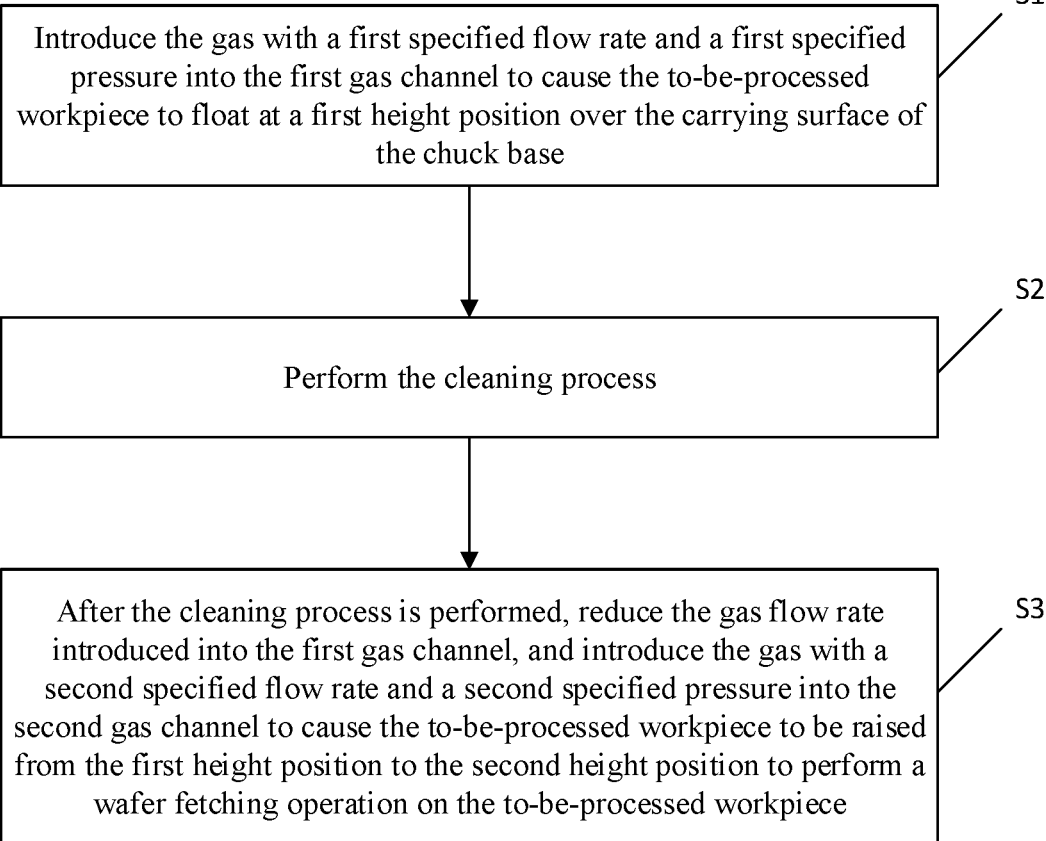

S1

Introduce the gas with a first specified flow rate and a first specified pressure into the first gas channel to cause the to-be-processed workpiece to float at a first height position over the carrying surface of the chuck base

S2

Perform the cleaning process

S3

After the cleaning process is performed, reduce the gas flow rate introduced into the first gas channel, and introduce the gas with a second specified flow rate and a second specified pressure into the second gas channel to cause the to-be-processed workpiece to be raised from the first height position to the second height position to perform a wafer fetching operation on the to-be-processed workpiece

FIG. 9

CHUCK STRUCTURE OF SEMICONDUCTOR CLEANING APPARATUS AND SEMICONDUCTOR CLEANING APPARATUS

CROSS-REFERENCES TO RELATED APPLICATIONS

This application is a continuation of International Application No. PCT/CN2021/077242, filed on Feb. 22, 2021, which claims priority to Chinese Application No. 202010171113.3 filed on Mar. 12, 2020, the entire content of all of which are incorporated herein by reference.

TECHNICAL FIELD

The present disclosure generally relates to the semiconductor manufacturing technology field and, more particularly, to a chuck structure of a semiconductor cleaning apparatus and a semiconductor cleaning apparatus.

BACKGROUND

In the field of a single-wafer cleaning apparatus of semiconductor manufacturing, an existing chuck structure generally clamps and releases a wafer. To facilitate a manipulator to fetch the wafer, the wafer needs to be raised from the chuck for a short distance when the chuck releases the wafer. Thus, the manipulator can move to a position between the wafer and the chuck, so that the wafer can fall on the manipulator.

At the present phase, when the wafer is fetched, the wafer may be raised through physical contact between the thimble and the wafer. Moreover, in some processes, for example, wafer back cleaning, the front side of the wafer faces downward. In this situation, the chuck and the front side of the wafer cannot have the physical contact. Therefore, a chuck structure that does not have the physical contact with the wafer no matter whether the process is performed, or the wafer is fetched.

SUMMARY

The present disclosure aims to solve at least one of the technical problems existing in the existing technology, and proposes a chuck structure of a semiconductor cleaning apparatus and the semiconductor cleaning apparatus, which can satisfy the requirements of different process steps in addition to that the to-be-processed workpiece is carried in a manner without a physical contact with the wafer.

In order to achieve the above object, the present disclosure provides a chuck structure of the semiconductor cleaning apparatus, including a chuck base configured to carry a to-be-processed workpiece, and further including a first gas channel and a second gas channel arranged in the chuck base and a gas inlet control device; wherein, both the first gas channel and the second gas channel are configured to spray a gas toward the to-be-processed workpiece, wherein a gas spray direction of the first gas channel is inclined toward outside of a surface of the to-be-processed workpiece that is opposite to the chuck base, and a gas spray direction of the second gas channel is perpendicular to the surface of the to-be-processed workpiece that is opposite to the chuck base; and the gas inlet control device is configured to selectively supply the gas to at least one of the first gas channel and the second gas channel, so that the to-be-processed workpiece is able to float at different height positions over the chuck base.

In some embodiments, the first gas channel includes a plurality of inclined channels arranged along a circumferential direction of the chuck base at an interval. The outlets of the inclined channels are located on a surface of the chuck base that is opposite to the to-be-processed workpiece, and included angles are formed between axes of the inclined channels and the surface of the chuck base that is opposite to the to-be-processed workpiece.

In some embodiments, the first gas channel further includes a first gas chamber. The first gas chamber is arranged in the chuck base and connected to the gas inlets of the inclined channels. The first gas chamber is connected to the gas inlet control device.

In some embodiments, the first gas chamber includes a central sub-chamber and an annular edge sub-chamber surrounding the central sub-chamber. the central sub-chamber is arranged at a center position of the chuck base and connected to the gas inlet control device, and the annular edge sub-chamber is connected to the air inlets of the inclined channels.

In some embodiments, the chuck base includes a carrying base and a first cover. On the carrying base, a first concave member is arranged on the surface that is opposite to the to-be-processed workpiece. The first cover is arranged in the first concave member, and a sealed space used as the first gas chamber is formed between a surface of the first cover that is away from the to-be-processed workpiece and the first concave member. The inclined channels are arranged on the first cover. The gas outlets of the inclined channels are located on the surface of the first cover that is opposite to the to-be-processed workpiece.

In some embodiments, the second gas channel includes a plurality of vertical channels arranged along the circumferential direction of the chuck base at the interval, and the gas outlets of the vertical channels are all located on the surface of the chuck base that is opposite to the to-be-processed workpiece, and the axes of the vertical channels are perpendicular to the surface of the chuck base that is opposite to the to-be-processed workpiece.

In some embodiments, the second gas channel further includes a second gas chamber. The second gas chamber is arranged in the chuck base and is connected to the gas inlets of the vertical channels, and the second gas chamber is connected to the gas inlet control device.

In some embodiments, the second gas channel includes a plurality of vertical channels and a second gas chamber. The plurality of vertical channels are arranged along the circumferential direction of the chuck base at an interval. The gas outlets of the vertical channels are located on a surface of the chuck base that is opposite to the to-be-processed workpiece. Axes of the vertical channels are perpendicular to the surface of the chuck base that is opposite to the to-be-processed workpiece. The second gas chamber is arranged in the chuck base and connected to the gas inlets of the vertical channels. The second gas chamber is connected to the gas inlet control device.

The chuck base further includes a second cover. For the first cover, a second concave member is arranged on a surface that is opposite to the to-be-processed workpiece, the second cover is arranged in the second concave member. A second sealed space used as the second gas chamber is formed between a surface of the second cover that is away from the to-be-processed workpiece and the second concave member; the vertical channels are arranged in the second cover, and the gas outlets of the vertical channels are located on a surface of the second cover that is opposite to the to-be-processed workpiece.

The chuck structure according to claim 1, wherein the gas inlet control device includes a first gas path and a second gas path. A gas outlet end of the first gas path and a gas outlet end of the second gas path are connected to the gas inlet of the first gas channel and the gas inlet of the second gas channel, respectively. A gas inlet end of the first gas path and a gas inlet end of the second gas path are configured to be connected to a gas source, and a pressure adjustment valve, a flow controller, and a pressure detection device are arranged on each of the first gas path and the second gas path.

T In some embodiments, a position limiting mechanism is further arranged on the carrying surface of the chuck base. The position limiting mechanism includes a plurality of position limiting rods and adjustment mechanisms arranged along a circumferential direction of the carrying surface of the chuck base at an interval. The position limiting rods are connected to the adjustment mechanisms, and the adjustment mechanisms are configured to drive the position limiting rods to move a long a radial direction of the chuck base relative to the chuck base to adjust a size of an area defined by the plurality of position limiting rods.

A semiconductor cleaning apparatus includes a process chamber. The chuck structure is arranged in the process chamber and configured to carry a to-be-processed workpiece. The chuck structure adopts the chuck structure of any one of claims 1 to 10.

Beneficial effects of the present disclosure are as follows.

In the chuck structure of the semiconductor cleaning apparatus provided by the embodiment of the present invention, the gas spray direction of the first gas channel in the chuck base body is inclined toward the outside of the surface of the workpiece opposite to the chuck base body, and the gas inlet control device is directed toward the first gas channel. When gas is introduced into the gas channel, the workpiece can be suspended at a specified height above the chuck base. At the same time, according to Bernoulli's principle, the above-mentioned inclined gas spray direction can make the workpiece to be subjected to pressure toward the chuck base. The attraction force in the direction helps to attract the to-be-processed workpiece at a specified height position, so as to achieve stable support for the to-be-processed workpiece during the process. The gas spray direction of the second gas channel in the chuck base is perpendicular to the surface of the workpiece to be processed that is opposite to the chuck base body. When the gas inlet control device may introduce the gas into the second gas channel, the vertical gas relative direction is relative to the inclined direction. The gas spray direction can stably suspend the workpiece to be processed at a higher position above the chuck base, so that the robot can carry out pick-and-place operations. As can be seen from the above, by using the gas inlet control device to selectively introduce gas into one of the first gas channel and the second gas channel, the workpiece can be suspended at different heights above the chuck base, and can also be suspended. Based on the principle of supporting the workpiece in two different gas stpray directions, according to the needs of different process steps, the choice between supporting the workpiece more stably and supporting the workpiece at a higher position can finally be achieved without On the basis of the physical contact of the wafer to carry the workpiece to be processed, it can meet the needs of different process steps.

The semiconductor cleaning apparatus provided by the embodiment of the present invention, by adopting the above-mentioned chuck structure provided by the embodiment of the present invention, can meet the needs of different process steps on the basis of supporting the workpiece to be processed without physical contact with the wafer., especially when performing a process or taking a piece, the workpiece can be carried in a manner that does not physically contact the workpiece to be processed.

BRIEF DESCRIPTION OF THE DRAWINGS

FIG. 9 is a schematic flow block diagram showing a workpiece carrying method of a cleaning process according to embodiments of the present disclosure.

DETAILED DESCRIPTION OF THE EMBODIMENTS

In order to make those skilled in the art better understand the technical solutions of the present disclosure, a chuck structure of a semiconductor cleaning apparatus and the semiconductor cleaning apparatus of embodiments of the present disclosure are described in detail below in connection with the accompanying drawings.

First Embodiment

Figure 1:
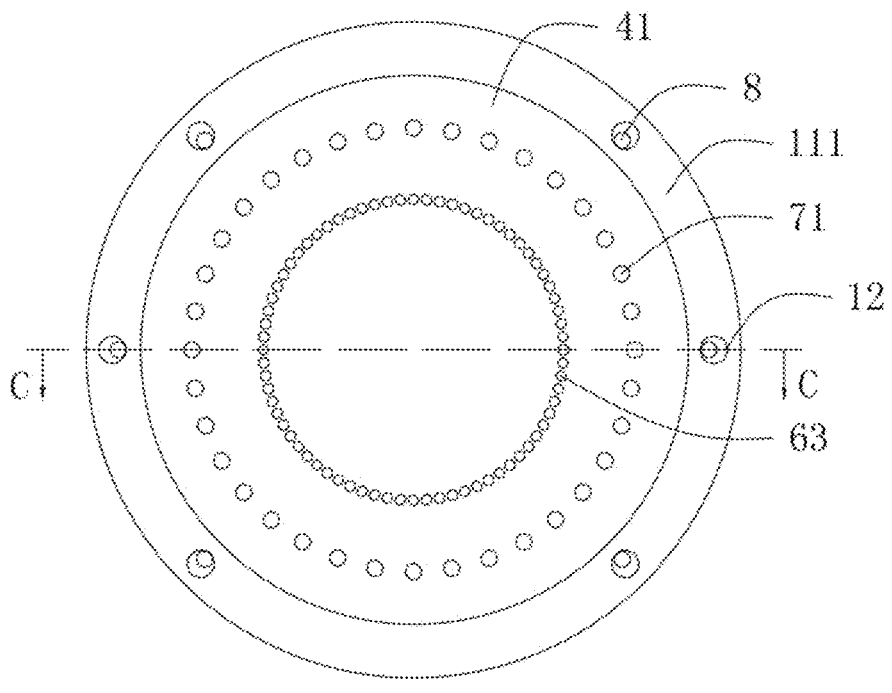
FIG. 1 is a schematic a top view of a chuck structure of a semiconductor cleaning apparatus according to a first embodiment of the present disclosure.
Figure 2:
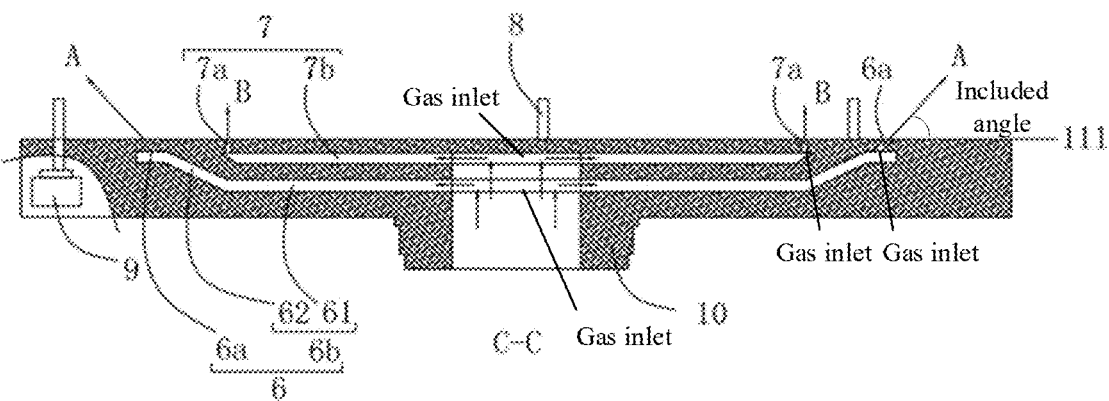
FIG. 2 is a schematic cross-sectional diagram along line C-C in FIG. 1.
Figure 3:
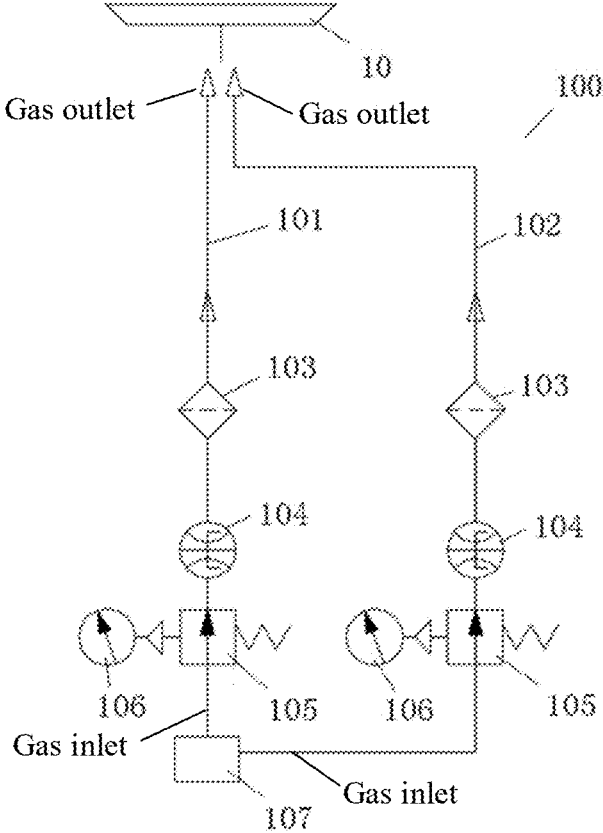
FIG. 3 is a schematic structural diagram of an air inlet control device according to the first embodiment of the present disclosure.

As shown in FIG. 1 to FIG. 3, the chuck structure of the present embodiment includes a chuck base 10 configured to carry a to-be-processed workpiece, a first gas channel 6 and a second gas channel 7 arranged in the chuck base 10, and a gas inlet control device 100. The chuck base 10 may include a surface opposite to the to-be-processed workpiece, which is hereinafter referred to as a carrying surface 111. Both the first gas channel 6 and the second gas channel 7 may be configured to spray gas toward the to-be-processed workpiece. Gas outlets of the first gas channel 6 and the second gas channel 7 are located on the carrying surface 111.

A spray direction of the first gas channel 6 may be inclined toward the outside of the surface of the to-be-processed workpiece that is opposite to the chuck base 10. For example, the spray direction of the first gas channel 6 is a direction of arrow A shown in FIG. 2. The direction and the carrying surface 111 forms an included angle. A spray direction of the second gas channel 7 may be perpendicular to the surface of the to-be-processed workpiece that is opposite to the carrying surface 111. In some embodiments, the spray direction of the second gas channel 7 is a direction of arrow B shown in FIG. 2.

In some embodiments, by inclinedly arranging the spray direction of the first gas channel 6 along the direction of arrow A, a gas flow rate on the surface of the to-be-processed workpiece that is opposite to the chuck base 10 may be increased to be greater than a gas flow rate on a surface of the to-be-processed workpiece that is away from the chuck base 10. According to Bernoulli's principle, the faster the gas flow rate is, the lower the pressure is, and otherwise, the slower the gas flow rate is, the higher the pressure is. Based on this, a pressure on the surface of the to-be-processed workpiece that is opposite to the chuck base 10 may be smaller than a pressure of the surface of the to-be-processed workpiece that is away from the chuck base 10. Thus, the to-be-processed workpiece may be subjected to an attraction force towards the carrying surface 111 of the chuck base 10. After forces on the two surfaces of the to-be-processed workpiece are balanced, the to-be-processed workpiece may stably float at a position with a specified height above the chuck base 10. Since the attraction force can more stably support the to-be-processed workpiece, the inclined spray direction may be applied to a process that requires higher support stability, e.g., cleaning. It should be noted that the height position of the to-be-processed workpiece floating above the chuck base 10 may be adjusted by controlling gas flow and gas pressure provided by the gas inlet control device 100 into the first gas channel 6.

By making the spray direction of the second gas channel 7 perpendicular to a surface of the to-be-processed workpiece that is opposite to the carrying surface 111, the gas flow rate on the surface of the to-be-processed workpiece that is opposite to the chuck base 10 may be reduced to be lower than a gas flow rate of the to-be-processed workpiece that is away from the chuck base 10. Thus, the pressure on the surface of the to-be-processed workpiece that is opposite to the chuck base 10 may be greater than the pressure on the surface of the to-be-processed workpiece that is away from the chuck base 10. Therefore, the to-be-processed workpiece may be subjected to a blowing force that faces a direction (i.e., toward an upper direction of FIG. 2) away from the carrying surface 111 of the chuck base 10. Thus, the to-be-processed workpiece may stably float at a position that is higher than the position with the specified height to satisfy requirements of different process steps to the height of the workpiece. It should be noted that the height position of the to-be-processed workpiece floating above the chuck base 10 may be adjusted by controlling the gas flow and the gas pressure in the second gas channel 7.

It can be seen from the above, by using the gas inlet control device 100 to selectively introduce gas into one of the first gas channel 6 and the second gas channel 7, the to-be-processed workpiece may float at different height positions above the chuck base 10. Moreover, based on the principle of supporting the to-be-processed workpiece in two different spray directions, and according to the requirements of the different process steps, selection may be performed on whether the to-be-processed workpiece is supported more stably, and the to-be-processed workpiece is supported at a higher position. Thus, based on supporting the to-be-processed workpiece without the physical contact with the wafer, the requirements of the different process steps may be satisfied.

In particular, the requirements of two steps of performing the process and performing fetching the wafer may be satisfied. If the process needs to be performed, for example, the gas can be introduced into the first gas channel 6 by using the gas inlet control device 100. Thus, the first gas channel 6 may spray gas inclinedly toward the to-be-processed workpiece to cause the to-be-processed workpiece to be subject to the attraction force that is toward the direction that is close to the chuck base. The attraction force may help to absorb the to-be-processed workpiece at the position with the specified height. Thus, the to-be-processed workpiece may be stably supported during the process. If the wafer needs to be fetched, for example, the gas may be introduced into the second gas channel 7 by using the gas inlet spray device 100. Thus, the second gas channel 7 may spray gas perpendicularly to the to-be-processed workpiece. Therefore, the to-be-processed workpiece may stably float at a position higher than the specified height position to satisfy the fetching and picking up requirements of the manipulator. That is, the manipulator may move to a position between the carrying surface 111 and the to-be-processed workpiece, such that the to-be-processed workpiece may fall on the manipulator.

When the above two steps are switched, for example, after the process steps are performed, and the fetching step needs to be performed. The gas may be kept to be introduced into the first gas channel 6 using the gas inlet control device 100. Meanwhile, the gas may start to be introduced to the second gas channel 7. Thus, the to-be-processed workpiece may be stably raised to a position higher than the currently specified height position to satisfy the fetching and releasing requirements of the manipulator. Of course, in practical applications, according to the different requirements of the process, the gas may be introduced one of the first gas channel and the second gas channel.

In the present embodiment, as shown in FIGS. 1 and 2, the first air channel 6 includes a plurality of inclined channels 6a arranged along a circumferential direction of the chuck base 10 at an interval. The gas outlets 63 of the inclined channels 6a may be located on the carrying surface 111. An axis of the inclined channel 6a may form an included angle with the carrying surface 111. By arranging the plurality of inclined channels 6a at the interval along the circumferential direction of the chuck base 10, the gas can be sprayed uniformly along the circumferential direction. Thus, the to-be-processed workpiece may be ensured to be stably raised up.

It is easy to understand that the inclined direction of the inclined channel 6a may be arranged with the gas outlet 63 to be closer to an outer edge of the carrying surface 111 than the gas inlet, which is beneficial to increase the gas flow rate on the surface of the to-be-processed workpiece that is opposite to the chuck base 10 and reduce the pressure on the surface. Thus, the to-be-processed workpiece may be subjected to the attraction force.

Optionally, included angles between an axis of the inclined channel 6a and the carrying surface 111 may range from 20° to 45°. Within this range, the to-be-processed workpiece may be ensured to be subjected to the attraction force.

In the present embodiment, as shown in FIG. 2, the first gas channel 6 further includes a first gas chamber 6b. The first gas chamber 6b is arranged in the chuck base 10 and is connected to the gas inlet of the inclined channel 6a. The first gas chamber 6b may be connected to the gas inlet control device (not shown in the figure). The gas provided by the air inlet control device may first enter the first gas chamber 6b, diffuses in the first gas chamber 6b, enters the inclined channel 6a, and is then sprayed out through the gas outlet 63 of the inclined channel 6a. The first gas chamber 6b may be configured to perform an gas uniform function and at the same time ensure that the gas can be stably and continuously sprayed from the gas outlet 63 of the inclined channel 6a.

Specifically, as shown in FIG. 2, the first gas chamber 6b includes a central sub-chamber 61 and an annular edge sub-chamber 62 surrounding the central sub-chamber 61. The central sub-chamber 61 is arranged at a center position of a carrier base 1 and is connected to the gas inlet control device. The annular edge sub-chamber 62 is connected to the gas inlet of the inclined channel 6a. In such an arrangement, the gas provided by the gas inlet control device may be introduced into the first gas chamber 6b from the central position of the chuck base 10, thereby improving the convenience and seal ability of the gas introduction.

In the present embodiment, the second gas channel 7 includes a plurality of vertical channels 7a arranged along the circumferential direction of the chuck base 10 at an interval. The gas outlets 71 of the vertical channels 7a are located on the carrying surface 111 of the chuck base 10. The axes of the vertical channels 7a are perpendicular to the carrying surface 111. By arranging the plurality of vertical channels 7a at the interval along the circumferential direction of the chuck base 10, the gas can be uniformly sprayed out along the circumferential direction of the to-be-processed workpiece, thereby ensuring that the to-be-processed workpiece can be stably held up by the gas.

Optionally, the gas outlets 71 of the vertical channels 7a may be closer to the center of the chuck base 10 than the gas outlets 63 of the first gas channels 6. Thus, the gas sprayed from the gas outlets 71 of the vertical channels 7a may be closer to the center of the to-be-processed workpiece, which is beneficial to reducing the gas flow rate on the surface of the to-be-processed workpiece that is opposite to the chuck base 10 and increase the pressure on the surface.

In the present embodiment, the second gas channel 7 further includes a second gas chamber 7b. The second gas chamber 7b may be arranged in the chuck base 10 and be connected to the gas inlets of the vertical channels 7a. The second gas chamber 7b may be connected to the gas inlet control device. The gas provided by the gas inlet control device may first enter the second gas chamber 7b, diffuse in the second gas chamber 7b, enter the vertical channels 7a, and be then sprayed out through the gas outlets 71 of the vertical channels 7a. The second gas chamber 7b may be configured to perform the gas uniform function and at the same time ensure that the gas can be stably and continuously sprayed out from the air outlets 71 of the vertical channels 7a.

In practical applications, by setting the diameter of the circumference where the gas outlets 71 of the vertical channels 7a are located and the diameters of the gas outlets 71 of the vertical channels 7a, a maximum blowing height of the to-be-processed workpiece may be adjusted. Optionally, the diameter of the circumference where the air outlets 71 of the vertical channels 7a are located may range from 150 to 190 mm. The diameters of the vertical channels 7a may range from 1.6 to 2 mm.

The gas inlet control device 100 may include a plurality of structures. For example, in the present embodiment, as shown in FIG. 3, the gas inlet control device 100 includes a first gas path 101 and a second gas path 102. A gas outlet end of the first gas path 101 and a gas outlet end of the second gas path 102 may be connected to the gas inlet of the first gas channel 6 and the gas inlet of the second gas channel 7 in the chuck base 10, respectively. A gas inlet end of the first gas path 101 and a gas inlet end of the second gas path 102 may be connected to a gas source 107. A pressure regulating valve 105, a flow controller 104, and a pressure detection device 106 may be arranged on each of the first gas path 101 and the second gas path 102.

In the present embodiment, both the first gas path 101 and the second gas path 102 may be introduced from the center of the chuck base 10 and are connected to the first gas chamber 6b and the second gas chamber 7b, respectively. Introduction positions are shown in FIG. 2. In addition, the pressure regulating valve 105 may be configured to adjust the gas pressure in the gas path where the pressure regulating valve 105 is located. The flow controller 104 may be configured to adjust the gas flow rate in the gas path where the flow controller 104 is located. The flow controller 104 may include, for example, a gas mass flow controller (MFC). The pressure detection device 106 may be configured to detect the gas pressure in the gas path. The pressure detection device 106 may include, for example, a pressure gauge.

In the present embodiment, a position limiting mechanism may be also arranged on the carrying surface 111 of the chuck base 10. The position limiting mechanism may be configured to limit the position of the to-be-processed workpiece floating above the chuck base 10. For example, the to-be-processed workpiece and the carrying surface 111 of the chuck base 10 may be concentrically arranged to prevent the to-be-processed workpiece from deviating relative to the chuck base 10 and also clamp an edge of the to-be-processed workpiece to improve the stability of the to-be-processed workpiece.

Specifically, as shown in FIG. 1 and FIG. 2, the position limiting mechanism includes a plurality of position limiting rods 8 and adjustment mechanisms distributed along the circumferential direction of the carrying surface 111 of the chuck base 10 at intervals. The position limiting rods 8 are connected to the adjustment mechanisms. The adjustment mechanisms may be configured to drive the position limiting rods 8 to move along a radial direction relative to the chuck base 10 to adjust the size of the circular area defined by the plurality of position limiting rods 8. Thus, the position limiting mechanism may be applied to to-be-processed workpieces of different sizes.

Optionally, as shown in FIG. 1, a plurality of through-holes 12 penetrating in a direction perpendicular to the upper surface 11 are arranged in the carrier base 1. The position limiting rods 8 may be arranged penetrating through the through-holes 12 in a one-to-one correspondence. The diameter of the position limiting rod 8 may be smaller than the diameter of the through-hole 12. As shown in FIG. 2, the adjustment mechanism includes a plurality of eccentric gears 9 and a driving source (not shown in the figure) configured to drive the eccentric gears 9 to rotate. The eccentric gears 9 may be connected to the position limiting rods 8 in a one-to-one correspondence. The rotation axes of the eccentric gears 9 may be offset from the axes of the corresponding through-holes 12. Driven by the drive source, the eccentric gear 9 may drive the position limiting rod 8 to rotate eccentrically relative to the axis of the through-hole 12. Thus, a horizontal distance between the position limiting rod 8 and the center of the carrying surface 111 may be changed, thereby adjusting the size of the circular area defined by the plurality of position limiting rods 8. Of course, in practical applications, the adjustment mechanism may also adopt any other structure, as long as the size of the circular area defined by the plurality of position limiting rods 8 can be adjusted.

Second Embodiment

Figure 4:
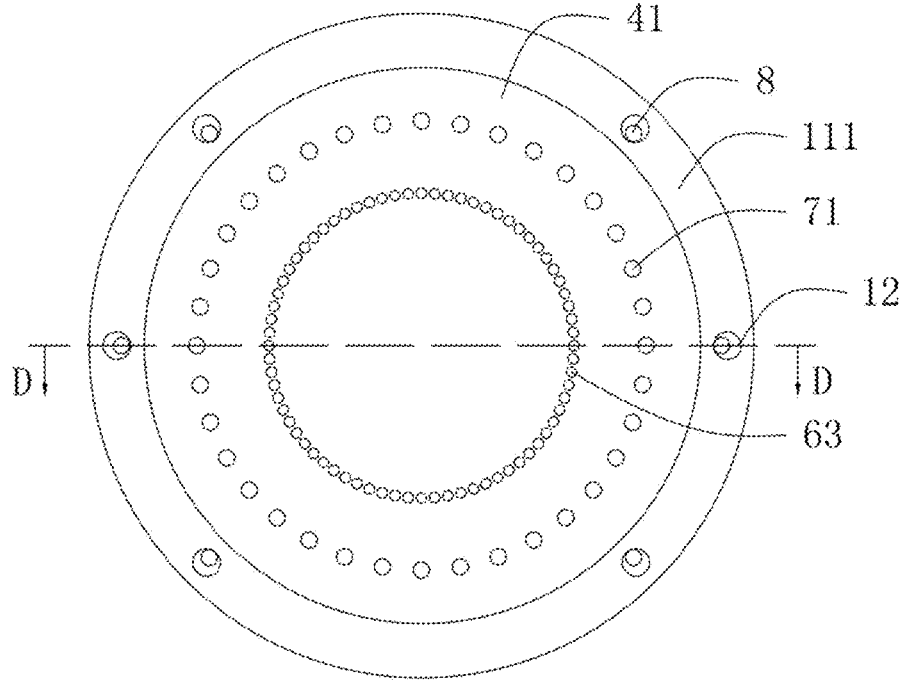
FIG. 4 is a schematic top view of a chuck structure of a semiconductor cleaning apparatus according to a second embodiment of the present disclosure.

A chuck structure provided in the present embodiment may be an improvement on the basis of the above-mentioned first embodiment. Specifically, with reference to FIG. 4 and FIG. 5, the chuck structure of the present embodiment also includes a chuck base 10, a first gas channel 6 and a second gas channel 7 arranged in the chuck base 10, and a gas inlet control device (not shown in the drawing). A difference in the chuck structure of the present embodiment compared to the first embodiment may include that the chuck base 10 includes a carrier base 1 and a first cover 4, which may be, for example, fixed together in a screw connection manner. On the carrier base 1, a first concave member 42 may be arranged on a surface (i.e., an upper surface 11) that is opposite to the to-be-processed workpiece. The first cover 4 may be arranged in the first concave member 42. An upper surface 41 of the first cover 4 may be flush with the upper surface 11 of the carrier base 1 to form the above-mentioned carrying surface 111. The inclined channel 6a may be arranged in the first cover 4. The gas outlet 63 of the inclined channel 6a may be located on the surface of the first cover 4 that is opposite to the to-be-processed workpiece.

Figure 5:
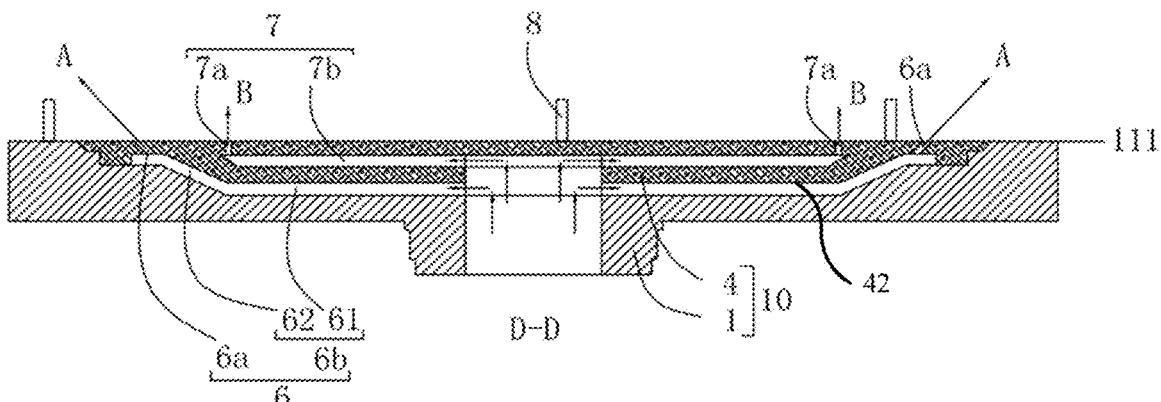
FIG. 5 is a schematic cross-sectional diagram along line D-D in FIG. 4.

In the present embodiment, as shown in FIG. 5, the first gas channel 6 further includes a first gas chamber 6b. The first gas chamber 6b is a first sealed space formed between a surface of the first cover 4 that is away from the surface (i.e., the bottom surface) of the to-be-processed workpiece and the first concave member, and is connected to the gas inlets of the inclined channels 6a. The first gas chamber 6b may be connected to the gas inlet control device. Specifically, the above-mentioned first gas chamber 6b includes a central sub-chamber 61 and an annular edge sub-chamber 62 surrounding the central sub-chamber 61, wherein the central sub-chamber 61 is disposed at the center of the carrier base 1. The central sub-chamber 61 may be arranged at the center position of the carrier base 1 and connected to the gas inlet control device. The annular edge sub-chamber 62 may be connected to the gas inlet of the inclined channel 6a. With such an arrangement, the gas provided by the gas inlet control device may be introduced into the first gas chamber 6b from the center position of the carrier base 1, thereby improving the convenience and seal ability of the gas introduction.

In the present embodiment, the second gas channel 7 may be arranged in the above-mentioned first cover 4. The spray direction of the second gas channel 7 may be perpendicular to the upper surface 41 of the first cover 4. Specifically, the spray direction of the second gas channel 7 may include the direction of arrow B shown in FIG. 5.

Other structures and functions of the chuck structure of the present embodiment are the same as the structures and functions of the above-mentioned first embodiment. The structures and functions of the above-mentioned first embodiment have already been described in detail and will not be repeated here.

Third Embodiment

Figure 6:
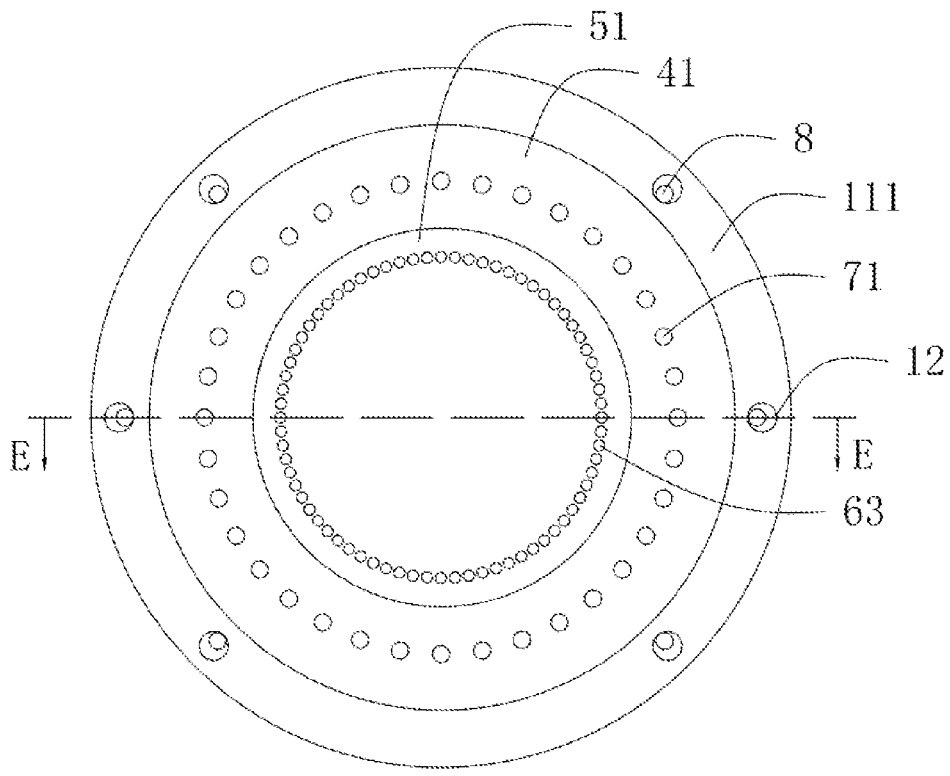
FIG. 6 is a top view of a chuck structure of a semiconductor cleaning apparatus according to a third embodiment of the present disclosure.

The chuck structure of the present embodiment may be an improvement made on the basis of the above-mentioned second embodiment. Specifically, with reference to FIGS. 6 to 8, the chuck structure of the present embodiment also includes a chuck base 10, a first gas channel 6 and a second gas channel 7 arranged in the chuck base 10, and a gas inlet control device (not shown in the drawing). A difference in the chuck structure of the present structure compared with the above-mentioned second embodiment may include that the chuck base 10 further includes a second cover 5 in addition to the carrier base 1 and the first cover 4. Specifically, in the present embodiment, a second concave member 52 may be arranged on the upper surface 11 of the first cover 4. The second cover 5 may be arranged in the second concave member 52. A surface (i.e., the upper surface 51) of the second cover 5 that is opposite to the to-be-processed workpiece may be flush with the upper surface 41 of the first cover 4. Thus, the upper surface 51 of the second cover 5, the upper surface of the first cover 4, and the upper surface 11 of the carrier base 1 may form the carrying surface 111 together.

The second gas channel 7 may be arranged in the above-mentioned second cover 5. The spray direction of the second gas channel 7 may be perpendicular to the surface of the to-be-processed workpiece that is opposite to the carrying surface 111. Specifically, the spray direction of the second gas channel 7 is the direction of arrow B shown in FIG. 7.

In the present embodiment, the second gas channel 7 includes a plurality of vertical channels 7a arranged along the circumferential direction of the second cover 5 at an interval. The gas outlets 71 of the vertical channels 7a may be located on the upper surface 51 of the second cover 5. The axes of the vertical channels 7a may be perpendicular to the upper surface 51 of the second cover 5. By arranging the plurality of vertical channels 7a along the circumferential direction of the second cover 5 at the interval, the gas can be uniformly sprayed out along the circumferential direction of the to-be-processed workpiece, thereby ensuring that the to-be-processed workpiece can be stably held up by the gas.

Figure 7:
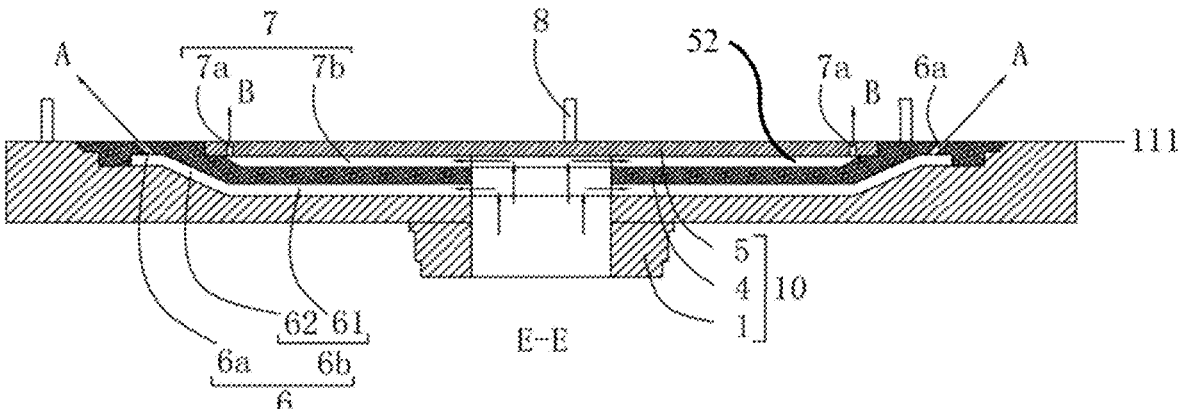
FIG. 7 is a schematic cross-sectional diagram along line E-E in FIG. 6.

In the present embodiment, as shown in FIG. 7, the second gas channel 7 further includes a second gas chamber 7b. The second gas chamber 7b may be a second sealed space formed between the surface (i.e., the bottom surface) of the second cover 5 that is away from the to-be-processed workpiece and the second concave member and may be connected to the gas inlets of the vertical channels 7a. The second gas chamber 7b may be connected to the gas inlet control device. The gas provided by the gas inlet control device may first enter the second gas chamber 7b, diffuse in the second gas chamber 7b, enter the vertical channels 7a, and be then sprayed out through the gas outlets 71 of the vertical channels 7a. The second gas chamber 7b may be configured to perform the gas uniform function and ensure that the gas can be stably and continuously sprayed out from the gas outlets 71 of the vertical channels 7a.

Figure 8:
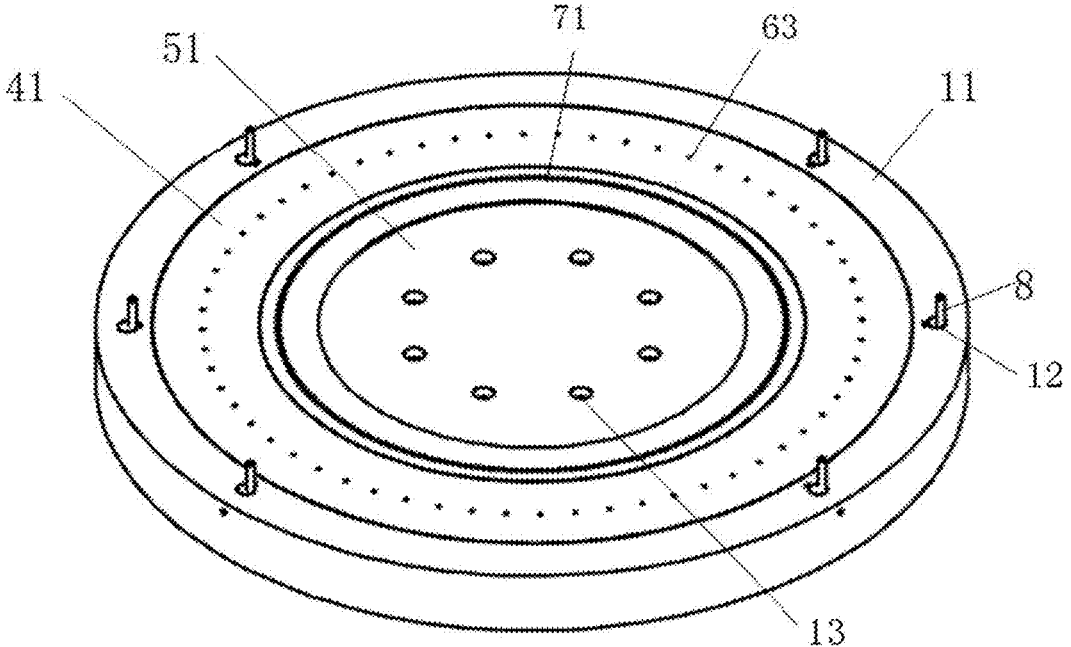
FIG. 8 is a schematic perspective diagram of a chuck structure according to the third embodiment of the present disclosure.

In the present embodiment, the carrier base 1, the first cover 4, and the second cover 5 may be, for example, fixed together in a screw connection manner. Specifically, as shown in FIG. 8, a plurality of through-holes 13 are correspondingly arranged in the carrier base 1, the first cover 4, and the second cover 5. The through-holes 13 may be located in an area where the upper surface 51 of the second cover 5 is located and on an inner side of the gas outlets 71 of the second gas channel 7 and may be installed in the through-holes 13 by fasteners such as screws, bolts, etc. Thus, the screw connection of the carrier base 1, the first cover 4, and the second cover 5 may be realized.

Other structures and functions of the chuck structure of the present embodiment may be the same as the structures and functions of the second embodiment. The structures and functions have been described in detail in the second embodiment and are not repeated here.

FIG. 9 is a schematic flow block diagram showing a workpiece carrying method for the to-be-processed workpiece carried by the chuck structure provided by the embodiments of the present disclosure. The workpiece carrying method includes the following steps.

At S1, the gas inlet control device is configured to introduce the gas with a first specified flow rate and a first specified pressure into the first gas channel 6 to cause the to-be-processed workpiece to float at a first height position over the carrying surface 111 of the chuck base 10.

At S2, the cleaning process is performed.

At S3, after the cleaning process is performed, the gas flow rate introduced into the first gas channel 6 is reduced, and the gas inlet control device is configured to introduce the gas with a second specified flow rate and a second specified pressure into the second gas channel 7 to cause the to-be-processed workpiece to be raised from the first height position to the second height position to perform a wafer fetching operation on the to-be-processed workpiece.

In summary, in the chuck structure of the semiconductor cleaning apparatus of the above-mentioned embodiments of the present disclosure, the gas inlet control device may be configured to selectively introduce the gas into one of the first gas channel and the second gas channel. Thus, the to-be-processed workpiece may float at different height positions over the chuck base. Based on the principle of supporting the to-be-processed workpiece in two different gas blowing directions, according to the different requirements of the process steps, selection may be performed between more stably supporting the to-be-processed workpiece and supporting the to-be-processed workpiece at a higher position. Eventually, in addition to the to-be-processed workpiece being carried in a manner that no physical contact exists with the wafer, the requirements of the different process steps may be satisfied.

As another technical solution, embodiments of the present disclosure provide a semiconductor cleaning apparatus, which may include a process chamber. The chuck structure may be arranged in the process chamber and configured to carry the to-be-processed workpiece. The chuck structure may adopt the chuck structure provided by embodiments of the present disclosure.

In practical applications, the semiconductor cleaning apparatus may include, for example, a single-chip cleaning apparatus, which may be configured to perform a cleaning process on the to-be-processed workpiece such as a wafer.

The semiconductor cleaning apparatus provided by embodiments of the present disclosure may satisfy the requirements of different process steps in addition to the to-be-processed workpiece being carried in a manner with no physical contact with the wafer by adopting the above-mentioned chuck structures provided by the above-mentioned embodiments of the present disclosure. The to-be-processed workpiece may be carried in a manner without physical contact with the to-be-processed workpiece, especially when the process or the wafer fetching is performed.

It can be understood that the above embodiments are merely exemplary embodiments used to illustrate the principle of the present disclosure. However, the present disclosure is not limited to this. For those skilled in the art, without departing from the spirit and essence of the present disclosure, various modifications and improvements can be made. These modifications and improvements are also within the protection scope of the present disclosure.

What is claimed is:

1. A chuck structure of a semiconductor cleaning apparatus comprising:

a chuck base configured to carry a to-be-processed workpiece, and a first gas channel and a second gas channel arranged in the chuck base and configured to spray a gas toward the to-be-processed workpiece, wherein a gas spray direction of the first gas channel is inclined toward outside of a surface of the to-be-processed workpiece that is opposite to the chuck base, and a gas spray direction of the second gas channel is perpendicular to the surface of the to-be-processed workpiece that is opposite to the chuck base; and a gas inlet control device configured to selectively supply the gas to at least one of the first gas channel and the second gas channel to cause the to-be-processed workpiece to float at different height positions over the chuck base;

wherein:

the first gas channel includes:

a plurality of inclined channels arranged along a circumferential direction of the chuck base at an interval; and a first gas chamber formed in the chuck base and connected to a plurality of gas inlets of the inclined channels;

the second gas channel includes:

a plurality of vertical channels arranged along the circumferential direction of the chuck base at intervals; and a second gas chamber formed in the chuck base and connected to a plurality of gas inlets of the vertical channels; and the chuck base includes:

a carrying base;

a first cover, a first concave member being arranged on a surface of the carrying base that is opposite to the to-be-processed workpiece, the first cover being arranged in the first concave member, and the inclined channels being arranged in the first cover; and a second cover arranged in a second concave member that is arranged on a surface of the first cover that is opposite to the to-be-processed workpiece, the vertical channels being arranged in the second cover, and an upper surface of the second cover, an upper surface of the first cover, and an upper surface of the carrying base being flush with each other to form a carrying surface to carry the to-be-processed workpiece.

2. The chuck structure according to claim 1, wherein: gas outlets of the inclined channels being located on a surface of the chuck base that is opposite to the to-be-processed workpiece, and included angles being formed between axes of the inclined channels and the surface of the chuck base that is opposite to the to-be-processed workpiece.

3. The chuck structure according to claim 2, wherein the first gas chamber is connected to the gas inlet control device.

4. The chuck structure according to claim 3, where in the first gas chamber includes:

a central sub-chamber arranged at a center position of the chuck base and connected to the gas inlet control device; and an annular edge sub-chamber surrounding the central sub-chamber and connected to the air inlets of the inclined channels.

5. The chuck structure according to claim 1, wherein a sealed space used as the first gas chamber being formed between a surface of the first cover that is away from the to-be-processed workpiece and the first concave member, and the gas outlets of the inclined channels being located on another surface of the first cover that is opposite to the to-be-processed workpiece.

6. The chuck structure according to claim 1, wherein:

the gas outlets of the vertical channels are all located on the surface of the chuck base that is opposite to the to-be-processed workpiece, and the axes of the vertical channels are perpendicular to the surface of the chuck base that is opposite to the to-be-processed workpiece.

7. The chuck structure according to claim 6, wherein the second gas chamber is connected to the gas inlet control device.

8. The chuck structure according to claim 5, wherein:

the second gas channel includes:

the plurality of vertical channels arranged along the circumferential direction of the chuck base at intervals, the gas outlets of the vertical channels being located on a surface of the chuck base that is opposite to the to-be-processed workpiece, and axes of the vertical channels being perpendicular to the surface of the chuck base that is opposite to the to-be-processed workpiece; and the second gas chamber arranged in the chuck base and connected to a plurality of gas inlets of the vertical channels and the gas inlet control device; and second sealed space used as the second gas chamber being formed between a surface of the second cover that is away from the to-be-processed workpiece and the second concave member, and the gas outlets of the vertical channels being located on a surface of the second cover that is opposite to the to-be-processed workpiece.

9. The chuck structure according to claim 1, wherein the gas inlet control device includes:

a first gas path and a second gas path, a gas outlet end of the first gas path and a gas outlet end of the second gas path being connected to a gas inlet of the first gas channel and a gas inlet of the second gas channel, respectively, a gas inlet end of the first gas path and a gas inlet end of the second gas path being configured to be connected to a gas source, and a pressure adjustment valve, a flow controller, and a pressure detection device being arranged on each of the first gas path and the second gas path.

10. The chuck structure according to claim 1, wherein:

a position limiting mechanism is further arranged on the carrying surface of the chuck base; and the position limiting mechanism includes a plurality of position limiting rods and adjustment mechanisms arranged along a circumferential direction of the carrying surface of the chuck base at an interval, the position limiting rods being connected to the adjustment mechanisms, and the adjustment mechanisms being configured to drive the position limiting rods to move a long a radial direction of the chuck base relative to the chuck base to adjust a size of an area defined by the plurality of position limiting rods.

11. A semiconductor cleaning apparatus comprising a process chamber, a chuck structure being arranged in the process chamber and configured to carry a to-be-processed workpiece, wherein the chuck structure includes:

a chuck base configured to carry a to-be-processed workpiece, and a first gas channel and a second gas channel arranged in the chuck base and configured to spray a gas toward the to-be-processed workpiece, wherein a gas spray direction of the first gas channel is inclined toward outside of a surface of the to-be-processed workpiece that is opposite to the chuck base, and a gas spray direction of the second gas channel is perpendicular to the surface of the to-be-processed workpiece that is opposite to the chuck base;

a gas inlet control device configured to selectively supply the gas to at least one of the first gas channel and the second gas channel to cause the to-be-processed workpiece to float at different height positions over the chuck base;

wherein:

the first gas channel includes:

a plurality of inclined channels arranged along a circumferential direction of the chuck base at an interval; and a first gas chamber formed in the chuck base and connected to a plurality of gas inlets of the inclined channels;

the second gas channel includes:

a plurality of vertical channels arranged along the circumferential direction of the chuck base at intervals; and a second gas chamber formed in the chuck base and connected to a plurality of gas inlets of the vertical channels; and the chuck base includes:

a carrying base;

a first cover, a first concave member being arranged on a surface of the carrying base that is opposite to the to-be-processed workpiece, the first cover being arranged in the first concave member, and the inclined channels being arranged in the first cover; and a second cover arranged in a second concave member that is arranged on a surface of the first cover that is opposite to the to-be-processed workpiece, the vertical channels being arranged in the second cover, and an upper surface of the second cover, an upper surface of the first cover, and an upper surface of the carrying base being flush with each other to form a carrying surface to carry the to-be-processed workpiece.

12. The semiconductor cleaning apparatus according to claim 11, wherein:

gas outlets of the inclined channels are located on a surface of the chuck base that is opposite to the to-be-processed workpiece, and included angles are formed between axes of the inclined channels and the surface of the chuck base that is opposite to the to-be-processed workpiece.

13. The semiconductor cleaning apparatus according to claim 12, wherein the first gas chamber is arranged in the chuck base and connected to the gas inlet control device.

14. The semiconductor cleaning apparatus according to claim 13, where in the first gas chamber includes:

a central sub-chamber arranged at a center position of the chuck base and connected to the gas inlet control device; and an annular edge sub-chamber surrounding the central sub-chamber and connected to the air inlets of the inclined channels.

15. The semiconductor cleaning apparatus according to claim 11, wherein a sealed space used as the first gas chamber being formed between a surface of the first cover that is away from the to-be-processed workpiece and the first concave member, and the gas outlets of the inclined channels being located on another surface of the first cover that is opposite to the to-be-processed workpiece.

16. The semiconductor cleaning apparatus according to claim 15, wherein:

the second gas channel includes:

the plurality of vertical channels arranged along the circumferential direction of the chuck base at intervals, the gas outlets of the vertical channels being located on a surface of the chuck base that is opposite to the to-be-processed workpiece, and axes of the vertical channels being perpendicular to the surface of the chuck base that is opposite to the to-be-processed workpiece; and the second gas chamber-arranged in the chuck base and connected to a plurality of gas inlets of the vertical channels and the gas inlet control device; and the chuck base further includes:

and a second sealed space used as the second gas chamber being formed between a surface of the second cover that is away from the to-be-processed workpiece and the second concave member, and the gas outlets of the vertical channels being located on a surface of the second cover that is opposite to the to-be-processed workpiece.

17. The semiconductor cleaning apparatus according to claim 11, wherein:

the gas outlets of the vertical channels are all located on the surface of the chuck base that is opposite to the to-be-processed workpiece, and the axes of the vertical channels are perpendicular to the surface of the chuck base that is opposite to the to-be-processed workpiece.

18. The semiconductor cleaning apparatus according to claim 17, wherein the second gas chamber is arranged in the chuck base and is connected to the gas inlet control device.

19. The semiconductor cleaning apparatus according to claim 11, wherein the gas inlet control device includes:

a first gas path and a second gas path, a gas outlet end of the first gas path and a gas outlet end of the second gas path being connected to a gas inlet of the first gas channel and a gas inlet of the second gas channel, respectively, a gas inlet end of the first gas path and a gas inlet end of the second gas path being configured to be connected to a gas source, and a pressure adjustment valve, a flow controller, and a pressure detection device being arranged on each of the first gas path and the second gas path.

20. The semiconductor cleaning apparatus according to claim 11, wherein:

a position limiting mechanism is further arranged on the carrying surface of the chuck base; and the position limiting mechanism includes a plurality of position limiting rods and adjustment mechanisms arranged along a circumferential direction of the carrying surface of the chuck base at an interval, the position limiting rods being connected to the adjustment mechanisms, and the adjustment mechanisms being configured to drive the position limiting rods to move a long a radial direction of the chuck base relative to the chuck base to adjust a size of an area defined by the plurality of position limiting rods.

* * * * *